(12) United States Patent
Ikeda et al.

(10) Patent No.: US 7,576,578 B2
(45) Date of Patent: Aug. 18, 2009

(54) FREQUENCY SYNTHESIZER AND CHARGE PUMP CIRCUIT USED FOR THE SAME

(75) Inventors: Takeshi Ikeda, Ohta-ku (JP); Hiroshi Miyagi, Yokohama (JP)

(73) Assignees: Niigata Seimitsu Co., Ltd., Niigata (JP); Ricoh Co., Ltd., Tokyo (JP)

( * ) Notice: Subject to any disclaimer, the term of this patent is extended or adjusted under 35 U.S.C. 154(b) by 0 days.

(21) Appl. No.: 11/834,305

(22) Filed: Aug. 6, 2007

(65) Prior Publication Data

US 2007/0280397 A1    Dec. 6, 2007

Related U.S. Application Data

(63) Continuation of application No. PCT/JP2005/018825, filed on Oct. 6, 2005.

(30) Foreign Application Priority Data

Feb. 7, 2005   (JP)   ............... 2005-030043

(51) Int. Cl.
*H03L 7/06* (2006.01)
(52) U.S. Cl. ..................... 327/157; 375/376
(58) Field of Classification Search ............. 375/354, 375/376, 374; 327/127, 541
See application file for complete search history.

(56) References Cited

U.S. PATENT DOCUMENTS

| | | | |
|---|---|---|---|
| 6,664,829 B1* | 12/2003 | Hughes | ............... 327/157 |
| 2005/0229066 A1* | 10/2005 | Wolff et al. | ............... 714/744 |
| 2006/0045222 A1* | 3/2006 | Kim et al. | ............... 375/354 |

FOREIGN PATENT DOCUMENTS

| | | |
|---|---|---|
| JP | 07-030416 | 1/1995 |
| JP | 11-214989 | 8/1999 |
| JP | 2001-177399 | 6/2001 |

* cited by examiner

*Primary Examiner*—David C Payne
*Assistant Examiner*—Tanmay K Shah
(74) *Attorney, Agent, or Firm*—Connolly Bove Lodge & Hutz LLP

(57) ABSTRACT

A frequency synthesizer includes an AND circuit (17) for detecting whether a frequency synthesizer is in a lock state according to a signal outputted from an Up terminal and a Down terminal of a phase comparator and switching circuits (18, 19) for switching between presence and absence of connections of constant current circuits (14, 15) constituting a charge pump circuit (4) according to the output signal of the AND circuit (17). When the AND circuit (17) has detected a high impedance state of the charge pump circuit (4), the switching circuits (18, 19) disconnects the constant current circuits (14, 15) by the switching circuits (18, 19). Thus, it is possible to eliminate current flowing into the charge pump circuit (4) without using a control signal from outside such as a power cut signal and an intermittent signal.

1 Claim, 2 Drawing Sheets

FREQUENCY SYNTHESIZER AND CHARGE PUMP CIRCUIT USED FOR THE SAME

RELATED APPLICATIONS

This application is a continuation application (under 35 U.S.C. § 120) of PCT/JP2005/018825 filed Oct. 6, 2005, which designated the United States and which in turn claims benefit of Japanese application 2005-030043 filed Feb. 7, 2005.

FIELD OF THE INVENTION

The present invention relates to a frequency synthesizer and a charge pump circuit used for the same.

BACKGROUND OF THE INVENTION

Generally, a radio communication apparatus uses as a local oscillator circuit a frequency synthesizer using a PLL (Phase Locked Loop). FIG. 2 shows the configuration of a conventional frequency synthesizer using a PLL. As shown in FIG. 2, the frequency synthesizer comprises a quartz oscillator circuit 1, a reference frequency divider 2, a phase comparator 3, a charge pump circuit 4, a low pass filter (LPF) 5, a voltage-controlled oscillator (VCO) 6 and a variable frequency divider 7.

The quartz oscillator circuit 1 generates signals of a prescribed frequency. The reference frequency divider 2 divides the frequency of signals outputted from the quartz oscillator circuit 1 in a fixed dividing ratio to generate the reference signal of the reference frequency. The phase comparator 3 detects the phase difference between the reference signal outputted from the reference frequency divider 2 and the feedback signal outputted from the variable frequency divider 7, according to the result and outputs signals of logic "L" or "H" from an Up terminal and a Down terminal. The charge pump circuit 4, by performing a charging action or a discharging action on the basis of the signals outputted from the Up terminal and the Down terminal of the phase comparator 3, outputs a signal proportional to the phase difference detected by the phase comparator 3.

The LPF 5 clears the signal outputted from the charge pump circuit 4 of the high frequency component, and outputs the cleared signal to the VCO 6. The VCO 6 oscillates at a frequency proportional to the voltage of the signal outputted from the LPF 5, outputs the resultant signal to outside the frequency synthesizer as a local oscillation signal, and also outputs it to the variable frequency divider 7. The variable frequency divider 7 divides the output frequency of the VCO 4 in a designated dividing ratio, and feeds back the result to the phase comparator 3 as a feedback signal.

Next, the operation of the conventional frequency synthesizer configured in this way will be described. The phase comparator 3 detects the phase difference between the reference signal outputted from the reference frequency divider 2 and the feedback signal outputted from the variable frequency divider 7. If the phase of the feedback signal is behind the phase of the reference signal, a signal of logic "L" having a pulse width matching that phase difference is outputted from the Up terminal of the phase comparator 3. To the Down terminal of the phase comparator 3 then, a signal of logic "H" is outputted.

On the other hand, if the phase of the feedback signal is ahead of the phase of the reference signal, a signal of logic "L" having a pulse width matching that phase difference is outputted from the Down terminal of the phase comparator 3. To the Up terminal of the phase comparator 3 then, a signal of logic "H" is outputted. If the phase of the feedback signal is synchronous with the phase of the reference signal, signals of logic "H" are outputted from the Up terminal and the Down terminal of the phase comparator 3.

The charge pump circuit 4 comprises transistors (switching elements) to whose gates the Up terminal and the Down terminal of the phase comparator 3 are connected and a constant current source circuit connected to each transistor. If it receives a signal of logic "L" from the Up terminal of the phase comparator 3, it acts to charge itself by using a constant current source. Or if it receives a signal of logic "L" from the Down terminal of the phase comparator 3, it acts to discharge itself by using a constant current source.

When the output terminal voltage is raised by a charging action by the charge pump circuit 4, the oscillation frequency of the VCO 6 rises. On the other hand, when the output terminal voltage is lowered by a discharging action by the charge pump circuit 4, the oscillation frequency of the VCO 6 falls. The local oscillation signal outputted from the VCO 6 is fed back to the phase comparator 3 via the variable frequency divider 7.

If the frequency of the feedback signal is lower than the frequency of the reference signal (if the phase of the feedback signal is behind the phase of the reference signal), the output frequency of the VCO 6 rises as stated above, accordingly the frequency of the feedback signal rises, and the phase difference from the reference signal narrows. This brings the frequency of the local oscillation signal outputted from the VCO 6 close to a desired frequency which is proportional to the frequency of the reference signal.

Or if the frequency of the feedback signal is higher than the frequency of the reference signal (if the phase of the feedback signal is ahead of the phase of the reference signal), the output frequency of the VCO 6 falls as stated above, accordingly the frequency of feedback signal falls, and the phase difference from the reference signal narrows. This brings the frequency of the local oscillation signal outputted from the VCO 6 close to the desired frequency which is proportional to the frequency of the reference signal.

In this way, the frequency synthesizer so operates as to eventually bring the frequency of the feedback signal closer to the frequency of the reference signal no matter whether the frequency of the feedback signal (a frequency proportional to the output frequency of the VCO 6) is higher or lower than the frequency of the reference signal, and the oscillation frequency of the VCO 6 is locked to a fixed frequency. The signals outputted from the phase comparator 3 when in this locked state are supposed to be signals of logic "H" both from the Up terminal and the Down terminal.

So far, attempts have been made to reduce power consumption in frequency synthesizers configured in this way, and a number of techniques have been proposed (see Patent Documents 1 and 2 for instance).

Patent Document 1: Japanese Patent Laid-Open No. 10-224212 Patent Document 2: Japanese Patent Laid-Open No. 6-284069

By the technique described in Patent Document 1, a phase comparator is provided with a power-cut input terminal, and a charge pump circuit is placed in a high impedance state (floating state) by forcibly raising the signals outputted from the Down terminal and the Up terminal of the phase comparator to logic "H" when a power-cut signal is inputted, and the current flowing therein to a transistor is thereby eliminated.

Or by the technique described in Patent Document 2, when intermittent signals during waiting are turned off, the actions of a reference frequency divider, a variable frequency divider and a pre-scaler are stopped to achieve a lower current consumption state, a charge pump circuit is placed in a high impedance state, and its output voltage is held at the level when the frequency synthesizer is locked.

DISCLOSURE OF THE INVENTION

However, the techniques described in Patent Documents 1 and 2, it is necessary to generate externally control signals such as the power-cut signal and the intermittent signals and input them to the frequency synthesizer. And it is further necessary to place the charge pump circuit in a high impedance state by using the externally inputted control signals. For this reason, there is a problem that, once the control signals are inputted and a high impedance state comes about, the high impedance state will be maintained after that unless the control signals are changed over and, even if there arises a phase lag between the reference signal and the feedback signal in that while, the PLL cannot be released from the locked state.

An object of the present invention, attempted to solve this problem, is to enable a constant current circuit in the charge pump circuit to be placed in a standby state without having to use control signals from outside such as a power-cut signal and intermittent signals, and thereby eliminate the currents flowing in the transistors to thereby reduce current consumption.

In order to solve the problem stated above, the configuration according to the invention comprises a lock detecting circuit for detecting whether or not the frequency synthesizer is in a locked state on the basis of a signal outputted from a phase comparator; and switching circuits which change over the connection and non-connection of the constant current circuits constituting the charge pump circuit according to the result of detection of a locked state by the lock detecting circuit.

The configuration of the invention described above, because switching circuits disconnect constant current circuits when the lock detecting circuit detects that the frequency synthesizer has been placed in a locked state and the charge pump circuit has run into a high impedance state, can eliminate the currents flowing in the charge pump circuit in high impedance state to thereby reduce current consumption without having to use control signals from outside such as a power-cut signal and intermittent signals.

DETAILED DESCRIPTION OF THE PREFERRED EMBODIMENTS

Figure 1:
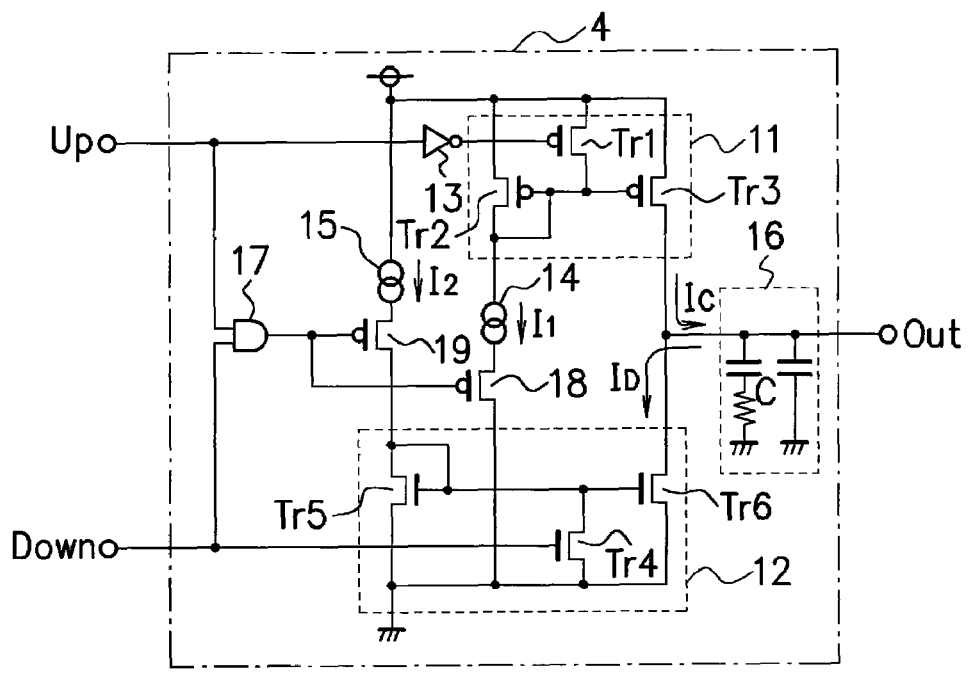
FIG. 1 shows an example of configuration of a charge pump circuit in this mode for implementing the invention.
Figure 2:
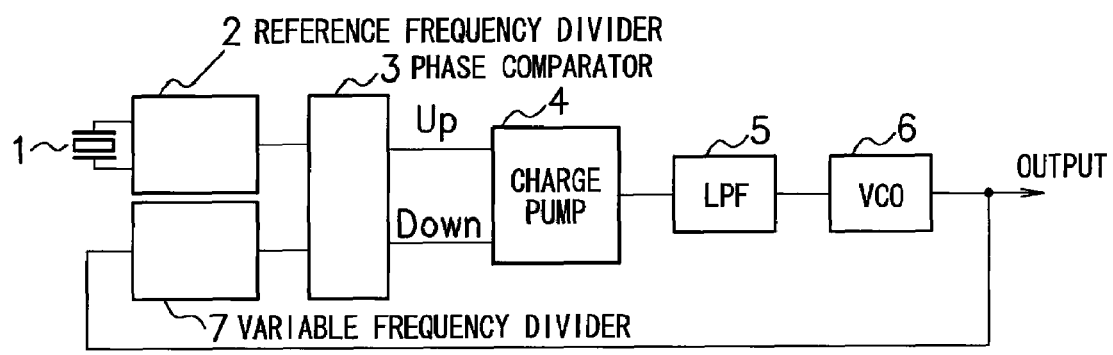
FIG. 2 shows an example of overall configuration of a frequency synthesizer.

An embodiment for implementing the present invention will be described below with reference to the drawings. FIG. 1 shows an example of configuration of a charge pump circuit 4 in this embodiment. The overall configuration of a frequency synthesizer using this charge pump circuit 4 is the same as what is shown in FIG. 2.

As shown in FIG. 1, the charge pump circuit 4 in this embodiment is provided with a first current mirror circuit 11, a second current mirror circuit 12, and first and second constant current source circuits 14 and 15 connected to these current mirror circuits 11 and 12. The first current mirror circuit 11, composed by current mirror connection of three pMOS transistors Tr1 through Tr3, performs a charging action by using the first constant current source circuit 14 in accordance with a signal outputted from the Up terminal of the phase comparator 3. The second current mirror circuit 12, composed by current mirror connection of three nMOS transistors Tr4 through Tr6, performs a discharging action by using the second constant current source circuit 15 in accordance with a signal outputted from the Down terminal of the phase comparator 3.

An inverting circuit 13 which inverts the logical levels of inputted signals and outputs the inverted signals is disposed at a stage preceding the first current mirror circuit 11 (between the Up terminal of the phase comparator 3 and the first current mirror circuit 11). The output node of the inverting circuit 13 is connected to the gate of the pMOS transistor Tr1 constituting part of the first current mirror circuit 11. The source of the pMOS transistor Tr1 is connected to a power supply terminal, and its drain is connected to the gates of the two current mirror-connected pMOS transistors Tr2 and Tr3. The sources of the pMOS transistors Tr2 and Tr3 are both connected to the power supply terminal, while the drain of the pMOS transistor Tr2 is connected to the first constant current source circuit 14 and the drain of the pMOS transistor Tr3, to the output terminal Out of the charge pump circuit 4.

The gate of the nMOS transistor Tr4 constituting part of the second current mirror circuit 12 is connected to the Down terminal of the phase comparator 3. The source of the nMOS transistor Tr4 is connected to a grounding terminal, and its drain is connected to the gates of the two current mirror-connected nMOS transistors Tr5 and Tr6. The sources of the nMOS transistors Tr5 and Tr6 are both connected to the grounding terminal, while the drain of the nMOS transistor Tr5 is connected to the second constant current source circuit 15, and the drain of the nMOS transistor Tr6, to the output terminal Out of the charge pump circuit 4.

A loop filter 16 is disposed between the first and second current mirror circuits 11 and 12 and the output terminal Out of the charge pump circuit 4. The loop filter 16 is provided with a condenser C. The charge pump circuit 4 in this embodiment, by performing a charging action or a discharging action on the condenser C of the loop filter 16 in accordance with signals outputted from the Up terminal and the Down terminal of the phase comparator 3, outputs a signal proportional to the phase difference detected by the phase comparator 3.

The charge pump circuit 4 in this embodiment is further provided with an AND circuit 17 and two pMOS transistors 18 and 19. The AND circuit 17, using signals outputted from the Up terminal and the Down terminal of the phase comparator 3 as two inputs, outputs the product of the logical levels thereof.

The AND circuit 17 outputs a signal of logic "H" only when signals outputted from the Up terminal and the Down terminal of the phase comparator 3 are both at logic "H". The case in which signals from the Up terminal and the Down terminal are both at "H" means a high impedance state of the charge pump circuit 4, namely the locked state of the frequency synthesizer. Therefore, the AND circuit 17 functions as a lock detecting circuit which detects whether or not the frequency synthesizer is in a locked state on the basis of a signal outputted from the phase comparator 3.

The output node of the AND circuit 17 is connected to the gates of the two pMOS transistors 18 and 19. The first pMOS transistor 18 is connected between the first constant current source circuit 14 and the grounding terminal. The second PMOS transistor 19 is connected between the second constant current source circuit 15 and the second current mirror circuit 12.

These two pMOS transistors 18 and 19 are turned on when a signal of logic "L" is outputted from the AND circuit 17 and turned off when a signal of logic "H" is outputted. Namely, the pMOS transistors 18 and 19 are turned on when the frequency synthesizer is in a non-locked state and turned off when it is in a locked state. In this way, these two pMOS transistors 18 and 19 function as switching circuits which change over the connection and non-connection of the constant current circuits 14 and 15 according to the result of detection of the locked state by the AND circuit 17.

Next, the operation of the charge pump circuit 4 configured as shown in FIG. 1 and the frequency synthesizer shown in FIG. 2 including the charge pump circuit 4 will be described. The phase comparator 3 detects the phase difference between the reference signal outputted from the reference frequency divider 2 and the feedback signal outputted from the variable frequency divider 7. If the phase of the feedback signal is behind the phase of the reference signal, a signal of logic "L" having a pulse width matching the phase difference is outputted from the Up terminal of the phase comparator 3. A signal of logic "H" is outputted from the Down terminal of the phase comparator 3 then.

The charge pump circuit 4, upon receiving the signal of logic "L" outputted from the Up terminal of the phase comparator 3, so acts as to charge the condenser C of the loop filter 16 by using the first constant current source circuit 14. Thus, the signal of logic "L" outputted from the Up terminal of the phase comparator 3 is inverted in logical level by the inverting circuit 13. This causes a signal of logic "H" to be inputted to the gate of the pMOS transistor Tr1 constituting part of the first current mirror circuit 11. As a result, the pMOS transistor Tr1 is turned off. When the pMOS transistor Tr1 is turned off, a signal of logic "L" is inputted to the gates of the two current mirror-connected pMOS transistors Tr2 and Tr3, and accordingly the pMOS transistors Tr2 and Tr3 are turned on.

On the other hand, as a signal of logic "L" is outputted from the Up terminal of the phase comparator 3, the output of the AND circuit 17 turns "L", and the first pMOS transistor 18 is turned on. This causes a constant current $I_1$, to flow from the power supply terminal to the grounding terminal via the pMOS transistor Tr2, the first constant current source circuit 14 and the first pMOS transistor 18.

The signal of logic "H" outputted from the Down terminal of the phase comparator 3 is inputted to the gate of the nMOS transistor Tr4 constituting part of the second current mirror circuit 12. This causes the nMOS transistor Tr4 to be turned on. When the nMOS transistor Tr4 is turned on, a signal of "L" is inputted to the gates of the two current mirror-connected nMOS transistors Tr5 and Tr6, and accordingly the nMOS transistors Tr5 and Tr6 are turned off.

Since the turning-on of the pMOS transistors Tr2 and Tr3 of the first current mirror circuit 11 and the turning-off of the nMOS transistors Tr5 and Tr6 of the second current mirror circuit 12 as described above, the constant current $I_1$, flowing through the pMOS transistor Tr2 causes a constant current $I_C$ to flow from the pMOS transistor Tr3 current mirror-connected to it toward the output terminal Out of the charge pump circuit 4. The condenser C of the loop filter 16 is charged by the constant current $I_C$ flowing in a manner of spilling out toward the output terminal Out.

The charging of the condenser C in this way causes the terminal voltage of the condenser C (the output terminal voltage of the charge pump circuit 4) to rise and accordingly the oscillation frequency of the VCO 6 rises. As a result, the frequency of the signal fed back from the VCO 6 to the phase comparator 3 via the variable frequency divider 7 rises. This serves to bring the frequency of the feedback signal, which was lower than the frequency of the reference signal, closer to the frequency of the reference signal. As a result, the frequency of the local oscillation signal outputted from the VCO 6 approaches a desired frequency which is proportional to the frequency of the reference signal.

On the other hand, if the phase of the feedback signal is ahead of the phase of the reference signal, a signal of logic "L" having a pulse width matching that phase difference is outputted from the Down terminal of the phase comparator 3. A signal of logic "H" is outputted from the Up terminal of the phase comparator 3 then. Upon receiving the signal of logic "L" from the Down terminal of the phase comparator 3, the charge pump circuit 4 so acts as to discharge the condenser C of the loop filter 16 by using the second constant current source circuit 15.

Thus, the signal of logic "L" outputted from the Down terminal of the phase comparator 3 is inputted to the gate of the nMOS transistor Tr4 constituting part of the second current mirror circuit 12. This causes the nMOS transistor Tr4 to be turned off. When the nMOS transistor Tr4 is turned off, a signal of "H" is inputted to the gates of two current mirror-connected nMOS transistors Tr5 and Tr6, and accordingly the nMOS transistors Tr5 and Tr6 are turned on.

On the other hand, as a signal of logic "L" is outputted from the Down terminal of the phase comparator 3, the output of the AND circuit 17 turns "L", and the second pMOS transistor 19 is turned on. This causes a constant current $I_2$ to flow from the power supply terminal to the grounding terminal via the second constant current source circuit 15, the second pMOS transistor 19 and the nMOS transistor Tr5.

The signal of logic "H" outputted from the Up terminal of the phase comparator 3 is inverted in logical level by the inverting circuit 13. This causes a signal of logic "L".to be inputted to the gate of the pMOS transistor Tr1 constituting part of the first current mirror circuit 11. As a result, the pMOS transistor Tr1 is turned on. When the pMOS transistor Tr1 is turned on, a signal of "H" is inputted to the gates of the two current mirror-connected pMOS transistors Tr2 and Tr3, and accordingly the pMOS transistors Tr2 and Tr3 are turned off.

Since the turning-off of the pMOS transistors Tr2 and Tr3 of the first current mirror circuit 11 and the turning-on of the nMOS transistors Tr5 and Tr6 of the second current mirror circuit 12 as described above, the constant current $I_2$ flowing through the nMOS transistor Tr5 causes a constant current $I_D$ to flow to the ground terminal via the nMOS transistor Tr6 current mirror-connected to the nMOS transistor Tr5 so as to pull it in from the condenser C of the loop filter 16, and the condenser C is thereby discharged.

The discharging of the condenser C in this way causes the terminal voltage of the condenser C (the output terminal voltage of the charge pump circuit 4) to fall and accordingly the oscillation frequency of the VCO 6 falls. As a result, the frequency of the signal fed back from the VCO 6 to the phase comparator 3 via the variable frequency divider 7 falls. This serves to bring the frequency of the feedback signal, which was higher than the frequency of the reference signal, closer to the frequency of the reference signal. As a result, the frequency of the local oscillation signal outputted from the VCO 6 approaches a desired frequency which is proportional to the frequency of the reference signal.

In this way, the frequency synthesizer, irrespective of whether the frequency of the feedback signal is higher or lower than the frequency of the reference signal, so acts as to eventually bring the frequency of the feedback signal closer to the frequency of the reference signal, and the oscillation frequency of the VCO 6 is locked to a fixed frequency. When in this locked state, namely when the phase of the feedback signal is synchronized with the phase of the reference signal, signals outputted from the phase comparator 3 become signals of logic "H" both at the Up terminal and the Down terminal.

The charge pump circuit 4, upon receiving a signal of logic "H" outputted from both the Up terminal and the Down terminal of the phase comparator 3, enters into a high impedance state. Thus, when both the Up terminal and the Down terminal become "H", both the pMOS transistor Tr1 of the first current mirror circuit 11 and the nMOS transistor Tr4 of the second current mirror circuit 12 are turned on. This causes all of the pMOS transistors Tr2 and Tr3 of the first current mirror circuit 11 and the nMOS transistors Tr5 and Tr6 of the second current mirror circuit 12 to be turned off, resulting in a high impedance state in which neither of the constant currents $I_C$ and $I_D$ flows.

Then, the inputting of signals of logic "H" outputted from both the Up terminal and the Down terminal of the phase comparator 3 into the AND circuit 17 turns the output of the AND circuit 17 up to "H" and causes the first and second pMOS transistors 18 and 19 to be turned off. This prevents both of the constant currents $I_1$, and $I_2$, which would flow from the power supply terminal to the grounding terminal, from flowing.

Thus in this embodiment, as a high impedance state is detected by the AND circuit 17 and, when in a high impedance state, the connection of the constant current circuits 14 and 15 are cut off by the first and second pMOS transistors 18 and 19, the currents $I_1$, and $I_2$ which would flow in the charge pump circuit 4 can be eliminated in the high impedance state, thereby enabling the current consumption to be reduced.

Figure 3:
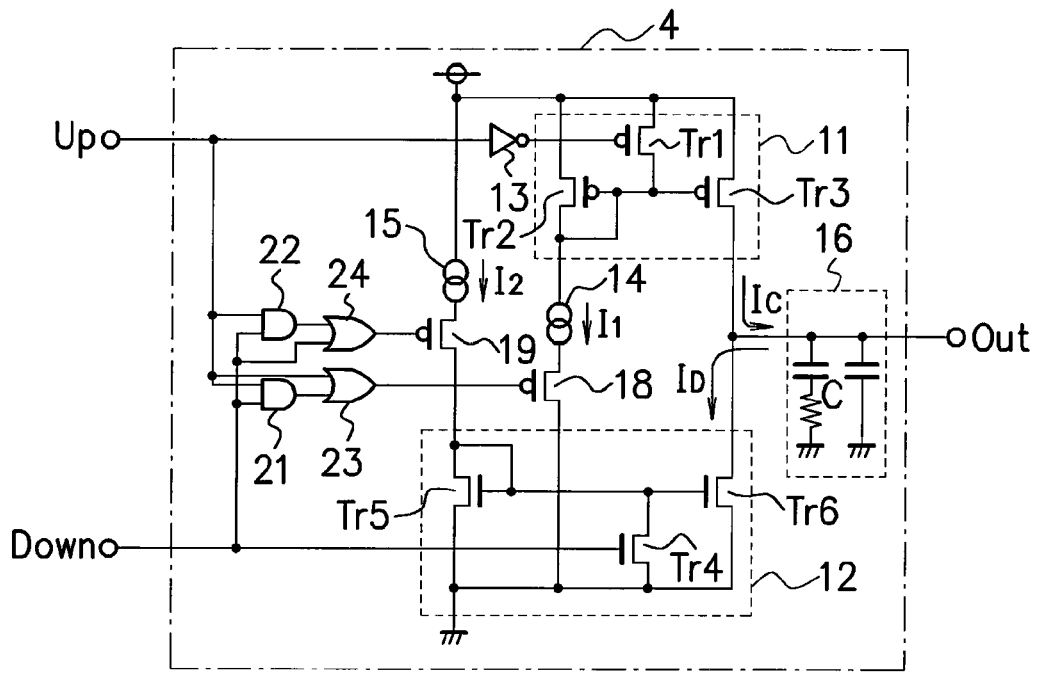
FIG. 3 shows another example of configuration of a charge pump circuit in this mode for implementing the invention.

Incidentally, though a single AND circuit 17 is commonly connected to the first pMOS transistor 18 and the second pMOS transistor 19 in this embodiment, the present invention is not limited to this. As shown in FIG. 3 for instance, in pairs of two AND circuits 21 and 22 and two OR circuits 23 and 24 may as well be provided as lock detecting circuits.

In the configuration shown in FIG. 3, the first AND circuit 21 receives as two inputs the signals outputted from the Up terminal and the Down terminal of the phase comparator 3, and outputs the product of the logical levels thereof. The first OR circuit 23 receives as two inputs the signal outputted from the Up terminal of the phase comparator 3 and the signal outputted from the first AND circuit 21, and outputs the sum of the logical levels thereof. The output node of this first OR circuit 23 is connected to the gate of the first pMOS transistor 18.

On the other hand, the second AND circuit 22 receives as two inputs the signals outputted from the Up terminal and the Down terminal of the phase comparator 3, and outputs the product of the logical levels thereof. The second OR circuit 24 receives as two inputs the signal outputted from the Down terminal of the phase comparator 3 and the signal outputted from the second AND circuit 22, and outputs the sum of the logical levels thereof. The output node of this second OR circuit 24 is connected to the gate of the second pMOS transistor 19.

If the phase of the feedback signal is behind the phase of the reference signal, a signal of logic "L" is outputted from the Up terminal of the phase comparator 3, a signal of logic "H" is outputted from the Down terminal, both the first and second AND circuits 21 and 22 output signals of logic "L". The first and second OR circuits 23 and 24 respectively output a signal of logic "L" and a signal of logic "H". This turns the second pMOS transistor 19 off and only the first pMOS transistor 18 on. Therefore, even in a non-locked state, the current $I_2$ which would flow in the charge pump circuit 4 can be eliminated, thereby enabling the current consumption to be reduced.

Or if the phase of the feedback signal is ahead of the phase of the reference signal, a signal of logic "H" is outputted from the Up terminal of the phase comparator 3 and a signal of logic "L" is outputted from the Down terminal, both the first and second AND circuits 21 and 22 output signals of logic "L". The first and second OR circuits 23 and 24 respectively output a signal of logic "H" and a signal of logic "L". This turns the first PMOS transistor 18 off and only the second pMOS transistor 19 on. Therefore, even in a non-locked state, the current $I_1$, which would flow in the charge pump circuit 4 can be eliminated, thereby enabling the current consumption to be reduced.

Or if the phase of the feedback signal is synchronous with the phase of the reference signal, signals of logic "H" are outputted from both the Up terminal and the Down terminal of the phase comparator 3, both the first and second AND circuits 21 and 22 output signals of logic "H". Both the first and second OR circuits 23 and 24 also output signals of logic "H". This causes both the first and second pMOS transistors 18 and 19 to be turned off. Therefore in the locked state, both the currents $I_1$ and $I_2$ which would flow in the charge pump circuit 4 can be eliminated, thereby enabling the current consumption to be substantially reduced.

Figure 4:
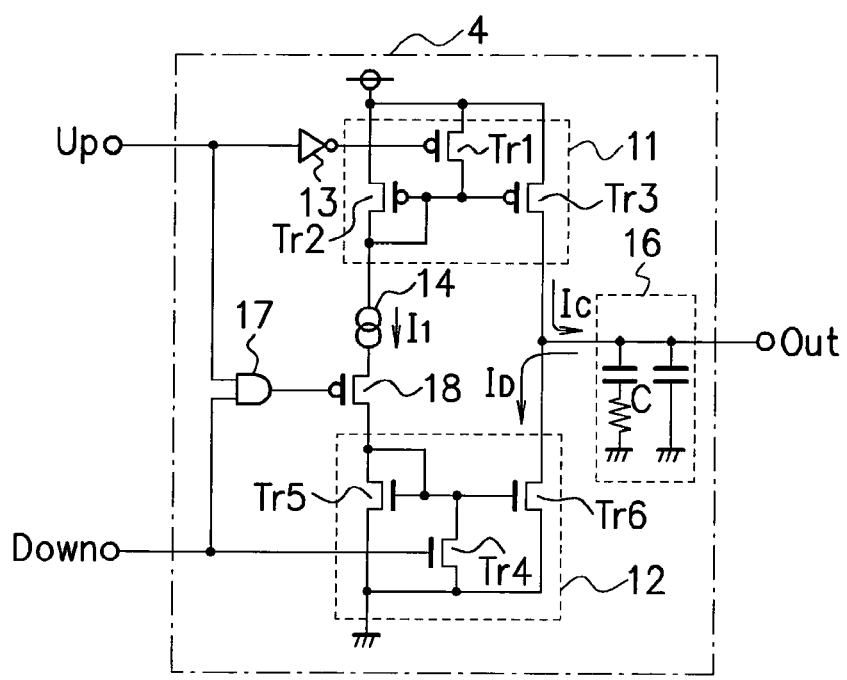
FIG. 4 shows still another example of configuration of a charge pump circuit in this mode for implementing the invention.

Although a case in which the first and second constant current circuits 14 and 15 are respectively provided for charging and discharging purposes with respect to this embodiment, the present invention is not limited to this. As shown in FIG. 4 for example, one constant current circuit can as well be used for both charging and discharging purposes. In this case, it is possible for instance to dispense with the second constant current circuit 15 and the second pMOS transistor 19 and to connect the drain of the nMOS transistor Tr5 constituting part of the second current mirror circuit 12 to the first pMOS transistor 18.

Further with respect to this embodiment described above, a case in which lock detecting circuit is disposed within the charge pump circuit 4 was cited, but it may also be provided outside the charge pump circuit 4. For example, the lock detecting circuit may as well be disposed inside the phase comparator 3.

Also, a case in which the pMOS transistor Tr1 is turned on when an Up signal of logic "L" is inputted to the gate of the pMOS transistor Tr1 constituting part of the first current mirror circuit 11 and the nMOS transistor Tr4 is turned on when a Down signal of logic "H" is inputted to the gate of the nMOS transistor Tr4 constituting part of the second current mirror circuit 12 was described with regard to this embodiment, it is also possible to compose the charge pump circuit by a circuit of logically inverse to this, and in that case the present invention can as well be applied.

Besides that, the mode for implementation described above concerns only some examples in practicing the present invention, but should not be interpreted as limiting the technical scope of the invention. Thus, the invention can also be implemented in various other ways without deviating from its true spirit or main features.

INDUSTRIAL APPLICABILITY

The invention is useful for techniques of reducing current consumption by eliminating currents flowing to transistors in a charge pump circuit in a frequency synthesizer and a charge pump circuit for use therein.

What is claimed is:

1. A charge pump circuit comprising current mirror circuits for performing a charging or discharging action on the basis of a signal outputted from a phase comparator by using constant current sources, and constant current source circuits connected to said current mirror circuits, the charge pump circuit comprising:
   a lock detecting circuit for detecting whether or not the frequency synthesizer is in a locked state on the basis of a signal outputted from said phase comparator; and
   switching circuits which disconnect the constant current source circuits when said lock detecting circuit detects a locked state, said lock detecting circuit further comprises:
   a first AND circuit which receives as two inputs signals outputted from two output terminals of said phase comparator and outputs the product of the logical levels thereof,
   a second AND circuit which receives as two inputs signals outputted from two output terminals of said phase comparator and outputs the product of the logical levels thereof,
   a first OR circuit which receives as two inputs the signal outputted from one of the two terminals of said phase comparator and a signal outputted from said first AND circuit, and outputs the sum of the logical levels thereof, and
   a second OR circuit which receives as two inputs the signal outputted from the other of the two terminals of said phase comparator and a signal outputted from said second AND circuit, and outputs the sum of the logical levels thereof.

* * * * *